United States Patent
Kim

(10) Patent No.: US 6,278,315 B1
(45) Date of Patent: Aug. 21, 2001

(54) HIGH VOLTAGE GENERATING CIRCUIT AND METHOD FOR GENERATING A SIGNAL MAINTAINING HIGH VOLTAGE AND CURRENT CHARACTERISTICS THEREWITH

(75) Inventor: Yong-Hwan Kim, Cheongju (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/235,553

(22) Filed: Jan. 22, 1999

(30) Foreign Application Priority Data

Jan. 23, 1998 (KR) .................................................. 98-2011

(51) Int. Cl.$^7$ ...................................................... G05F 1/10
(52) U.S. Cl. .............................. 327/536; 327/541; 363/60
(58) Field of Search ................................. 327/536, 537, 327/538, 540, 541, 543; 365/189.09, 227; 323/316, 59, 60

(56) References Cited

U.S. PATENT DOCUMENTS

| | | | |
|---|---|---|---|
| 5,422,586 | 6/1995 | Tedrow et al. ....................... | 327/306 |
| 5,553,295 | * 9/1996 | Pantelakis et al. ................... | 363/60 |
| 5,699,313 | * 12/1997 | Foss et al. ............................ | 327/589 |
| 5,835,420 | * 11/1998 | Lee et al. ......................... | 365/189.09 |
| 5,841,725 | * 11/1998 | Kang et al. ........................... | 327/536 |
| 6,002,599 | * 12/1999 | Chow ..................................... | 363/59 |
| 6,091,282 | * 7/2000 | Kim ..................................... | 327/536 |

* cited by examiner

*Primary Examiner*—Timothy P. Callahan
*Assistant Examiner*—Terry L Englund

(57) ABSTRACT

A high voltage generating circuit includes a charge pump unit for generating a high voltage by pumping or precharging an external source voltage in accordance with externally generated first and second clock signals and first and second high voltage clock signals, a voltage control unit for generating a voltage control signal in accordance with a high voltage signal output from the charge pump unit and an externally generated enable signal, controlling the high voltage signal of the charge pump unit to a predetermined voltage level, and outputting a final output signal to an external memory cell, and a high voltage clock generating unit for level-shifting the first and second clock signals output from an external clock generator in accordance with the voltage control signal output from the voltage control unit and the externally generated enable signal, and outputting the first and second high voltage clock signals to the charge pump unit. The circuit decreases an unnecessary power consumption by maintaining a regular output voltage without regard to the variation of the external source voltage when generating a high voltage and a high current which are required to program or erase a flash memory.

19 Claims, 3 Drawing Sheets

CLK1

CLK2

 FIG. 4A CLKX
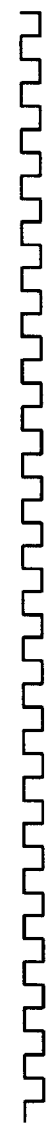 FIG. 4B CLKY
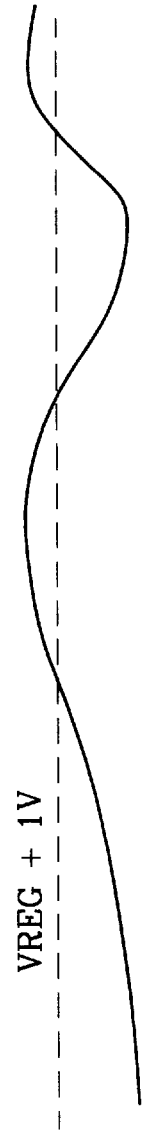 FIG. 4C VOUT VREG + 1V
FIG. 4D Vreg_ref Vref
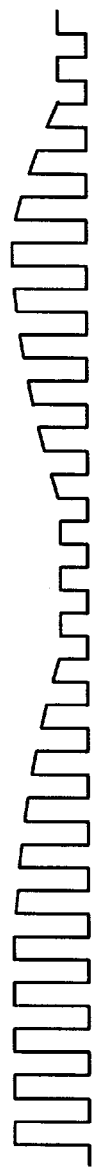 FIG. 4E HCLKX
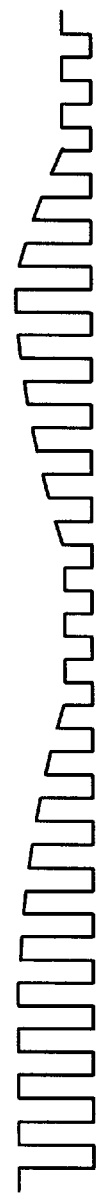 FIG. 4F HCLKY

HIGH VOLTAGE GENERATING CIRCUIT AND METHOD FOR GENERATING A SIGNAL MAINTAINING HIGH VOLTAGE AND CURRENT CHARACTERISTICS THEREWITH

BACKGROUND OF THE INVENTION

1. Field of the Invention

The present invention relates to a high voltage generating circuit and method for using the same, and more particularly, to an improved high voltage generation circuit that generates a high voltage during a programming operation or an erasing operation with regard to a flash memory apparatus, and a method for generating a signal that maintains high voltage and current characteristics therewith.

2. Description of the Background Art

When a flash memory is programmed or erased, a high voltage and a high current need to be applied to memory cell drains in the flash memory. Such a high voltage and a high current are generated through an external voltage. At this time, in order to reduce unnecessary power consumption, the high voltage should be maintained at a constant level. To achieve such a constant voltage, a circuit is required for regularly maintaining an output voltage without regard to an external power source or an output current.

U.S. Pat. No. 5,422,586 discloses a conventional charge pump for generating a high voltage and a high current during an erasing operation or a programming operation in a flash memory array.

As shown in FIG. 1, the charge pump according to the background art includes NMOS transistors NM11-NM14 serially connected between an external source voltage Vcc and an output voltage Vout. A pair of clock signals CLK1, CLK2 are provided from sources SOURCE1 and SOURCE2 through capacitors C24-C26 to the charge pump circuit, and the same pairs of clock signals CLK1, CLK2 are furnished from the sources SOURCE1 and SOURCE2 through capacitors C21-C23 to the charge pump circuit. Also, MOS transistors NM15-NM17 are correspondingly connected to gate terminals of the NMOS transistors NM11-NM13.

The operation of the conventional charge pump circuit will now be described.

First, when the second clock signal CLK2 has a high level, as shown in FIG. 2, the second clock signal CLK2 is applied to the gate terminals of the transistors NM15, NM17, thereby turning on the transistors NM15, NM17. Also, the clock signal CLK2 is applied to the gate terminal of transistor NM12, and a high voltage is applied from the second source SOURCE2 to the drain terminal of the transistor NM12. Since high voltages are applied to the gate and drain of the transistor NM12, the transistor NM12 is turned on. When the transistor NM12 is turned on, its gate and drain are initialized with the same value. However, when the first clock signal CLK1 has a low signal, the transistor NM16 for connecting the gate and drain of the transistor NM12 is turned off. Therefore, when the transistor NM12 is turned on for some time, the high voltage at the drain of the transistor NM12 is transmitted to charge the first capacitor C21 and the second capacitor C22, thereby decreasing the voltage level at the drain of the transistor NM12. This causes the gate voltage to become higher than the drain or the source voltage of the transistor NM12. In order to increase the current for the next stage, the switching is completely done without lowering any threshold voltage drop.

When the voltages at the drain and the source of the transistor NM12 become equal, the gate voltage of the transistor is increased and almost turned on. If the second clock signal CLK2 has a low level, the transistor NM16 is turned on. When the second clock signal CLK2 has a low level, the voltage drop at the gate of the transistor NM12 allows the transistor NM12 to turn off. Also, in response to a low level second clock signal CLK2, the voltages at the gate terminals of the transistors NM15, NM17 are lowered to turn off the transistors NM15, NM17, so that the drains and gates of each of the transistors NM11, NM13 become different from each other. When the first clock signal CLK1 has a high level, the transistor NM16 is completely switched on, causing the voltage level of the gate and drain of the transistor NM12 to equalize. At the same time, when the voltage at the drain of the transistor is increased according to the external source voltage Vcc, the voltages at the gate terminals of the transistors NM11, NM12 are increased by the external source voltage Vcc.

The switching transistors NM11, NM13 are driven in a manner similar to the switching transistor NM12 in transmitting a charge to the capacitors C21, C23. The gates and drains of such transistors have same voltages in initial stages, however, the drain voltage is dropped as much as the voltage transmitted to the capacitors C21, C23 in the subsequent stage so that the transistors are completely turned on without dropping a threshold voltage thereof.

Therefore, when the clock signal CLK1 has a high level, the switching transistor NM11 is turned on and the current supplied by the external source voltage Vcc is used to charge capacitor C21. By contrast, when the first clock signal CLK1 has a low level, the switching transistor NM11 is turned off. Then, when the second clock signal CLK2 has a high level, the switching transistor NM12 is turned on and the capacitor C21 is supplied with a charge to be stored from the second clock signal CLK2 which serves to charge the capacitor C22. When the second clock signal CLK2 has a low level, the switching transistor NM12 is switched off, and when the first clock signal CLK1 is again turned to a high level, the external source voltage Vcc also serves to charge the capacitor C21. Subsequently, the switching transistor NM13 is turned on, and the capacitor C22 applies the pulse from the first clock signal CLK1 as well as the stored charge to the capacitor C23. When the first clock signal CLK 1 has a low level, the switching transistor NM13 is turned off. When the second clock signal CLK2 is later turned to a high level, the output transistor NM14 is turned on to supply a pumped voltage at Vout, which pumped voltage has a level approximately equal to the number of stages plus one multiplied by the value of source voltage Vcc less the threshold voltage drop of the output transistor NM14.

As a result, the charging of the capacitor C23 and the positive swing of the second clock signal CLK2 raise the voltage level on the capacitor C23 sufficiently above the level of output voltage Vout to cause the conduction of the switching transistor NM14. This provides the desired output voltage while furnishing the high level of current necessary to erase and program flash EEPROM memory arrays.

According to the background art, when the second clock signal CLK2 has a high level, the gate and drain of the transistor NM12 become identical in electrical potential, and the charge pumped in the capacitor C21 begins to be transferred to the capacitor C22. Also, as the charge begins its transmission, the potential at the drain of the NMOS transistor NM12 becomes higher than that of its gate, whereby all the potential is transferred without the threshold voltage drop. However, when the precharged potential has been completely transferred to the output terminal, power consumption is unnecessarily experienced since the threshold voltage of the NMOS transistor NM14 is dropped. Also, since the background art employs the transmission transistor NM12 (e.g., an S-type transistor of about 0.3V) having a low threshold voltage, there occurs a voltage difference between the drain and the source of the transmission transistor NM12, whereby the voltage level of the output signal Vout becomes lower than the desired voltage level.

Further, the background art has a disadvantage in that the external voltage is not available to other devices (e.g., a 5V of source voltage Vcc) when the external source voltage is set to a different constant voltage level (e.g., a 3V of source voltage Vcc).

SUMMARY OF THE INVENTION

The present invention is directed to a system and method that substantially obviates one or more of the problems experienced due to the above and other limitations and disadvantages of the related art.

It is an object of the present invention to provide a high voltage generating circuit which is capable of maintaining a constant output thereof without regard variation of the external source voltage and which is capable of decreasing an unnecessary power consumption when generating a high voltage and a high current required during a programming operation or an erasing operation of a flash memory apparatus.

Other and further objects, features and advantages of the present invention will be set forth in the description that follows, and in part will become apparent from the detailed description, or may be learned by practice of the invention.

To achieve the above-described objects, there is provided a high voltage generating circuit which includes a charge pump unit for generating a high voltage by pumping or precharging an external source voltage in accordance with externally generated first and second clock signals and first and second high voltage clock signals, a voltage control unit for generating a voltage control signal in accordance with a high voltage signal output from the charge pump unit and an externally generated enable signal, controlling the high voltage signal of the charge pump unit to a predetermined voltage level, and outputting a final output signal to an external memory cell, and a high voltage clock generating unit for level-shifting the first and second clock signals output from an external clock generator in accordance with the voltage control signal output from the voltage control unit and the externally generated enable signal, and outputting the first and second high voltage clock signals to the charge pump unit.

The object and advantages of the present invention will become more readily apparent from the detailed description given hereinafter. However, it should be understood that the detailed description and specific example, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings, which are given only by way of illustration and thus are not limitative of the present invention, and wherein:

FIGS. 4A through 4F are timing diagrams illustrating respective signals in the circuit of FIG. 3.

DETAILED DESCRIPTION OF THE PREFERRED EMBODIMENTS

With reference to the accompanying drawings, the high voltage generating circuit according to the preferred embodiments of the present invention will now be described.

Figure 1:
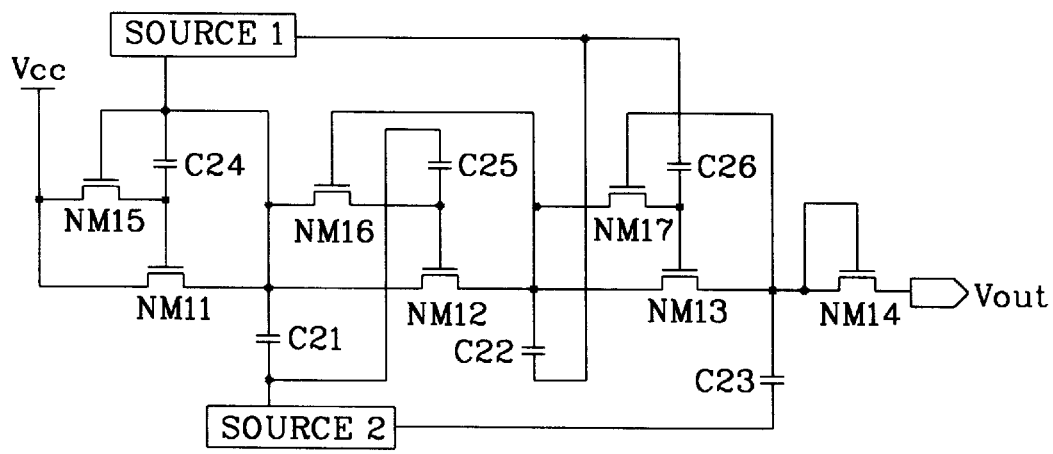
FIG. 1 is a circuit diagram illustrating a high voltage generating circuit according to the background art.
Figure 2A:
FIGS. 2A and 2B are timing diagrams illustrating clock signals output from sources in the circuit of FIG. 1.
Figure 2B:
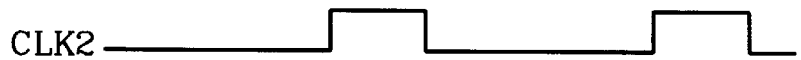
Figure 3:
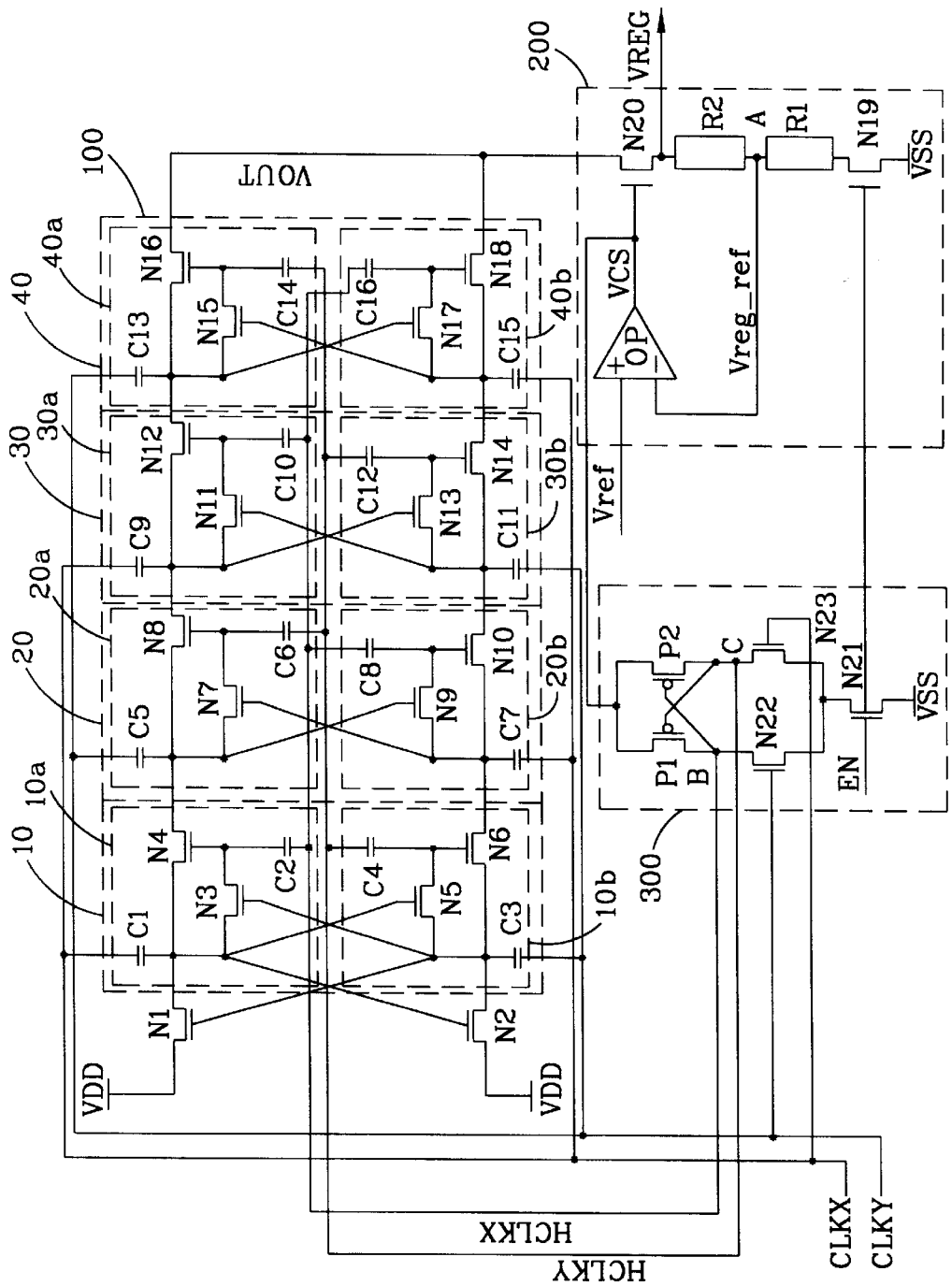
FIG. 3 is a circuit diagram illustrating a high voltage generating circuit according to a preferred embodiment of the present invention.

As shown in FIG. 3, the high voltage generating circuit according to the present invention includes a charge pump unit 100, a voltage control unit 200 and a high voltage clock generating unit 300.

The charge pump unit 100 executes a precharge operation of an external source voltage VDD to generate a high voltage in accordance with externally generated first and second clock signals CLKX, CLKY and first and second high voltage clock signals HCLKX, HCLKY.

The voltage control unit 200 generates a voltage control signal VCS in accordance with a high voltage signal VOUT output from the charge pump unit 100 and an externally generated enable signal EN, controls the high voltage signal VOUT of the charge pump unit 100 in a predetermined voltage level, and outputs a final output signal VREG to an external memory cell (not shown).

The high voltage clock generating unit 300 level-shifts the first and second clock signals CLKX, CLKY output from an external clock generator (not shown) in accordance with the voltage control signal VCS output from the voltage control unit 200 and the externally generated enable signal EN, and outputs the first and second high voltage clock signals HCLKX, HCLKY to the charge pump unit 100.

In further detail, the charge pump unit 100 includes first and second NMOS transistors N1, N2 with their drains connected to external voltage VDD, and first to fourth pump units 10, 20, 30 and 40. The first pump unit 10 is connected to the gates and sources of the first and second NMOS transistors N1, N2. The first pump unit 10 pumps and precharges the external voltage VDD received from the first and second NMOS transistors N1, N2 in accordance with the externally generated clock signals. The second through fourth pump units 20, 30 and 40 are connected in series with the first pump unit 10. They respectively pump or precharge the output voltage of the first pump unit 10 and output the high voltage signal VOUT to the voltage control unit 200 in accordance with the externally generated clock signals.

Specifically, the first pump unit 10 is provided with a first upper pump unit 10a and a first lower pump unit 10b. The first upper pump unit 10a is connected to the source of the first NMOS transistor N1 and to the gate of the second NMOS transistor N2. It executes a pumping or precharging operation in accordance with the first clock signal CLKX output from the external clock signal generator (not shown) and the first high voltage clock signal HCLKX output from the high voltage clock generating unit 300. The first lower pump unit 10b is connected to the gate of the first NMOS transistor N1 and to the source of the second NMOS transistor N2. It executes a pumping or precharging operation in accordance with the second clock signal CLKY output from the external clock signal generator (not shown) and the second high voltage clock signal HCLKY output from the high voltage clock generating unit 300.

The first upper pump unit 10*a* includes a first capacitor C1 with its input terminal supplied with the first clock signal CLKX from the external clock signal generator (not shown) and its output terminal connected to the source of the first NMOS transistor N1, a second capacitor C2 with its input terminal supplied with the first high voltage clock signal HCLKX from the high voltage clock generating unit 300, a third NMOS transistor N3 with its drain connected to the output terminal of the first capacitor C1 and the gate of the second NMOS transistor N2 and the source of third NMOS transistor N3 connected to the output terminal of the second capacitor C2, and a fourth NMOS transistor N4 with its drain connected to the output terminal of the first capacitor C1 and its gate connected to the output terminal of the second capacitor C2 and the source of the third NMOS transistor N3.

The first lower pump unit 10 *b* includes a third capacitor C3 with its input terminal supplied with the second clock signal CLKY from the external clock signal generator (not shown) and its output terminal connected to the source of the second NMOS transistor N2, a fourth capacitor C4 with its input terminal supplied with the second high voltage clock signal HCLKY from the high voltage clock generating unit 300, a fifth NMOS transistor N5 with its drain connected to the output terminal of the third capacitor C3 and the gate of the first NMOS transistor N1 and its gate connected to the drain of the third NMOS transistor N3 and its source connected to the output terminal of the fourth capacitor C4, and a sixth NMOS transistor N6 with its drain connected to the source of the second NMOS transistor N2 and its gate connected to the output terminal of the fourth capacitor C4 and the source of the fifth NMOS transistor N5.

The first and third capacitors C1, C3 in the first pump unit 10 are called pump capacitors, the second and fourth capacitors C2, C4 called gate pump capacitors, and fourth and sixth NMOS transistor N4, N6 called transfer transistors. Also, the first through fourth pump units 10, 20, 30 and 40 are connected in serial with one another, wherein the upper and lower pump units 10*a*–10*b*, 20*a*–20*b*, 30*a*–30*b* and 40*a*–40*b* are provided symmetrical correspondingly facing each other. The second through fourth pump units 20, 30 and 40 are arranged and configured in the same format as the first pump unit 10, that their descriptions will be omitted although given different numerals.

The voltage control unit 200 includes a 19th NMOS N19 with its gate supplied with the externally generated enable signal EN and its source supplied with ground voltage VSS, a first resistance R1 having one end connected to the drain of the 19th NMOS transistor N19, a second resistance R2 connected to another end of the first resistance R1, a comparator OP for comparing a reference voltage Vref with a signal Vreg_ref at node A between the first resistance R1 and the second resistance R2 and for outputting voltage control signal VCS, and a 20th NMOS transistor N20 with its gate supplied with the voltage control signal VCS of the comparator OP and its drain supplied with the high voltage signal VOUT of the charge pump unit 100 and its source connected to the other end of the second resistance R2 to control the high voltage signal VOUT to achieve a constant voltage level to output the final output signal VREG to the external memory cell (not shown) in accordance with the voltage control signal VCS of the comparator OP.

The high voltage clock generating unit 300 includes a 21st NMOS transistor N21 having a gate that is supplied with the externally generated enable signal EN and a source supplied with the ground voltage VSS, 22nd and 23rd NMOS transistors N22 and N23 having sources that are connected in common with the drain of the 21st NMOS transistor N21 and gates correspondingly supplied with the second and first clock signals CLKY, CLKX from the external clock generating unit (not shown), and first and second PMOS transistors P1 and P2 having their drains connected to those of the 22nd and 23rd NMOS transistors N22 and N23, their gates cross-connected to the drains of the $23^{rd}$ and $22^{nd}$ NMOS transistors N23 and N22, respectively, and their sources supplied with the voltage control signal VCS output from the comparator OP of the voltage control unit 200.

Node B, connected between the drains of the first PMOS transistor P1 and the 22nd NMOS transistor N22, outputs the first high voltage clock signal HCLKX to the charge pump unit 100. Node C, connected between the drains of the second PMOS transistor P2 and the 22nd NMOS transistor N22, outputs the second high voltage clock signal HCLKY to the charge pump unit 100.

The operation of the high voltage generating circuit according to the present invention will now be explained.

In FIG. 3, the respective pump units 10, 20, 30 and 40 in the charge pump unit 100 serve to generate a high voltage by alternately executing a pumping operation and a precharging operation in accordance with the first and second clock signal, CLKX, CLKY output from the external clock generator (not shown) and the first and second high voltage clock signals HCLKX, HCLKY output from the high voltage clock generating unit 300.

That is, when the first and second clock signals CLKX, CLKY have low levels, the pump capacitors carry out precharging operations, and when the first and second clock signals CLKX, CLKY have high levels, the pump capacitors carry out pumping operations to transfer current to a subsequent stage. At this time, the first and second clock signals CLKX, CLKY are received in different phases, and adjacent pump unit pairs respectively carry out pumping operations and precharging operations. Also, the first and second high voltage clock signals HCLKX, HCLKY are identical to the first and second clock signals CLKX, CLKY in phase; however, voltage magnitudes are received with difference.

In the first pump unit 10 of FIG. 3, when the second clock signal CLKY received from the clock signal generator (not shown) has a low level, since the first clock signal CLKX is in a high level, the first upper pump unit 10*a* carries out a pumping operation and accordingly the second NMOS transistor N2 is turned on. The output terminal of the third capacitor C3 performing a pumping operation of the first lower pump unit 10*b* is sufficiently precharged using the external source voltage VDD. At the same time, the fifth NMOS transistor N5 is turned on and the output terminal of the fourth capacitor C4 for the gate pumping is precharged to the level to the external voltage VDD.

At this time, since the externally generated first clock signal CLKX has a high level, the second lower pump unit 20*b* in the second pump unit 20 also carries out a pumping operation. The voltage at the gate of the sixth NMOS transistor N6 of the first lower pump unit 10*b* in the first pump unit 10 has a level that equals the external source voltage VDD and that is accordingly turned off, whereby no charge transfer occurs from the seventh capacitor C7 for pumping to the third capacitor C3.

Subsequently, when the second clock signal CLKY is turned to a high level, the third capacitor C3 performs a pumping operation, and the output terminal of the third capacitor C3 increases to a value (2VDD) of twice the external source voltage VDD. At the same time, since the second high voltage clock signal HCLKY received from the high voltage clock generating unit 300 has a high level, the fourth capacitor C4 for the gate pumping executes the pumping operation, whereby the gate voltage of the sixth NMOS transistor N6 for the transmission is raised to 2VDD+α, where α represents the amount of voltage raised by the pumping operation. Here, the voltage level of the second high voltage clock signal HCLKY is VDD+α, and a maximum of α becomes a value of VDD.

Also, because the externally applied first clock signal CLKX has a low level, the second lower pump unit 20b in the second pump unit 20 performs a precharging operation, and the second and fifth NMOS transistors N2, N5 are turned off. At this time, the voltage at the gate of the sixth NMOS transistor N6 for the transmission is α (about VDD level) higher than that at the output terminal of the third capacitor C3 for the pumping. Therefore, the gate of the sixth NMOS transistor N6 is turned on, and the charge pumped into the third capacitor C3 is transferred through the sixth NMOS transistor N6 to the seventh capacitor C7 without a voltage drop. Also, the second lower pump unit 20b in the second pump unit 20 carries out a precharging operation because the first clock signal CLKX is in a low level.

Next, when the second clock signal CLKY is again turned to a low level, the second lower pump unit 20b in the second pump unit 20 carries out a pumping operation, thereby precharging the 11th capacitor C11 for the pumping of the third lower pump unit 30b in the third pump unit 30 through the 10th NMOS transistor N10.

Likewise, the first to fourth pump units 10–40 alternately execute the pumping and precharging operation to output a high voltage signal VOUT. That is, when the first and third lower pump units 10b, 30b carry out a precharging operation in accordance with the second clock signal CLKY and the second high voltage clock signal HCLKY which are in low levels, the second and fourth lower pump units 20b, 40b execute a pumping operation in accordance with the first clock signal CLKX and the first high voltage clock signal HCLKX which are in low levels.

Also, when the clock signals change their phases, different operations are carried out. Although the upper pump units 10a, 20a, 30a and 40a are identical to the lower pump units 10b, 20b, 30b and 40b in their makeup, the upper pump units 10a, 20a, 30a and 40a makeup contrary to the lower pump units 10b, 20b, 30b and 40b depending upon the phases of the clock signals.

Here, the high voltage signal VOUT is output from the charge pump unit 100. It is ideal when it becomes a voltage level which satisfies an expression of VOUT=(n+1)VDD, where n represents the number of pumping stages.

Meanwhile, the voltage control unit 200 controls the high voltage signal VOUT of the charge pump unit 100 to obtain a predetermined voltage level, which is output as the resultant value.

At an initial stage, the 19th NMOS transistor N19 is turned on by the externally applied enable signal EN to allow the low level signal equivalent to the ground voltage VSS to be applied to the comparator OP, which compares the low level signal to the reference voltage Vref and outputs the voltage control signal VCS of the reference voltage Vref level. In accordance with the output signal of the comparator OP, the 20th NMOS transistor N20 is turned on, so that the high voltage signal VOUT in the charge pump unit 100 is output to the external memory cell (not shown) as a final output signal VREG.

Also, the high voltage signal VOUT of the charge pump unit 100 is confined by the first and second resistances R1, R2, and the comparator OP compares the voltage-dropped voltage Vreg_ref, as shown in FIG. 4D, with the reference voltage Vref and outputs the voltage control signal VCS.

In accordance with the compared result (voltage control signal VCS), the extent at which the 20th NMOS transistor N20 is turned on becomes different so that the externally output final output signal VREG approximates the voltage level predetermined during its design. Here, the predetermined voltage level set during the design stage is a voltage level that satisfies VOUT=VREG+1V, wherein 1V is determined at a random base.

That is, when the voltage of the high voltage signal VOUT output from the charge pump unit 100 is higher than the voltage level set during the design, the voltage control signal VCS of the comparator OP becomes lowered. Also, in accordance with the voltage control signal VCS, the 20th NMOS transistor N20 is controlled so that the final output signal VREG is not higher than the voltage level performed during the design so as to approximate that signal.

If the voltage level of the high voltage signal VOUT output from the charge pump unit 100 is lower than the voltage level set during the design, the voltage control signal VCS of the comparator OP becomes higher. Then, the 20th NMOS transistor N20 is controlled in accordance with the output signal VCS and the final output signal VREG is output in a level not lower than the level predetermined during the design, whereby a constant output signal VREG is output.

At the same time, the voltage control signal VCS of the comparator OP is applied to the high voltage clock generating unit 300.

The high voltage clock signal generator 300 adjusts the levels of the first and second clock signals CLKX, CLKY received from the clock signal generator (not shown) and outputs the adjusted signals to the charge pump unit 100, as shown in FIGS. 4E and 4F.

That is, as the voltage level of the high voltage signal VOUT of the charge pump unit 100 becomes lower than the predetermined level, if the voltage level of the voltage control signal VCS of the comparator OP becomes raised (up to a maximum value of 2VDD), the first and second high voltage clock signals HCLKX, HCLKY output from the high voltage clock generating unit 300, shown in FIGS. 4E and 4F, are also raised. The first and second high voltage clock signals HCLKX, HCLKY are applied to the charge pump unit 100 and serve to raise the voltage levels at the gates of the transmission transistors N4, N6, N8, N10, N12, N14, N16, N18 to be higher than their drains by a maximum value of VDD, and the transmission transistors N4, N6, N8, N10, N12, N14, N16, N18 allow the pumped charges to be transferred to the next stage without a voltage drop, whereby the voltage level of the high voltage signal VOUT of the charge pump unit 100 becomes raised.

As the voltage level of the high voltage signal VOUT in the charge pump unit 100 becomes higher than the predetermined voltage level, if the voltage level of the voltage control signal VCS of the comparator OP becomes lowered, the first and second high voltage clock signals HCLKX, HCLKY output from the high voltage clock generating unit 300 shown in FIGS. 4E and 4F are also lowered (down to a minimum value of 0V).

Also, as the voltage levels of the first and second high voltage clock signals HCLKX, HCLKY are lowered, the voltage levels at the gates of the transmission transistors N4, N6, N8, N10, N12, N14, N16, N18 become lower than their drains, and there occur voltage drops at the transmission transistors N4, N6, N8, N10, N12, N14, N16, N18, so that the pumped charges are not transferred to the next stage, whereby the voltage level of the high voltage signal VOUT in the charge pump unit 100 is dropped.

Specifically, the high voltage clock generating unit 300 converts the voltage levels of the first and second clock signals CLKX, CLKY of FIGS. 4A and 4B received from the external clock generator (not shown) in accordance with the voltage control signal VCS output from the voltage control unit 200 in order to control the voltage level of the high voltage signal VOUT output from the charge pump unit 100, whereby the first and second high voltage clock signals HCLKX, HCLKY are output to the charge pump unit 100. Then, the charge pump unit 100 repeatedly carries out the same operation.

As the external source voltage VDD or the loading of the charge pump unit 100 is changed, the magnitude of the high voltage signal VOUT output from the charge pump unit 100 becomes significantly changed. The repeated operation allows the voltage level of the output signal VREG output from the external memory cell (not shown) to maintain a constant value.

As described above, the present invention significantly decreases an unnecessary power consumption by maintaining a constant output voltage without regard to the variation of the external source voltage, enabling it to generate a high voltage and a high current which are required to program or erase the flash memory.

Further, when the memory cell is programmed, although the external source voltage remains in a constant level, the voltage supplied to the memory cell is exponentially decreased, thereby allowing the loading of the charge pump unit to be gradually decreased. The decrease of the loading of the charge pump unit restrains an unnecessary operation, thereby maintaining a constant output voltage while confining the operation according to the output, as well as decreasing the power consumption.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to embrace the appended claims.

What is claimed is:

1. A high voltage generating circuit, comprising:
    a charge pump unit for generating a high voltage by pumping or precharging an external source voltage in accordance with externally generated first and second clock signals and first and second high voltage clock signals;
    a voltage control unit for generating a voltage control signal in accordance with the high voltage output from the charge pump unit and an externally generated enable signal, the voltage control unit controlling the high voltage generated by the charge pump unit to achieve a predetermined voltage and outputting the predetermined voltage to an external memory cell; and
    a high voltage clock generating unit for level-shifting the first and second clock signals output from an external clock signal generator in accordance with the voltage control signal output from the voltage control unit and the externally generated enable signal, and outputting the first and second high voltage clock signals to the charge pump unit, wherein voltage swings of the first and second high voltage clock signals change as an amplitude of the voltage control signal changes.

2. The high voltage generating circuit of claim 1, wherein the charge pump unit comprises:
    first and second transistors having drains that are connected to the external source voltage;
    a first pump unit connected to gates and sources of the first and second transistors, pumping and precharging the external source voltage received from the first and second transistors in accordance with the externally generated clock signals; and
    second through fourth pump units connected in series with the first pump unit, pumping or precharging an output voltage of the first pump unit and outputting the high voltage to the voltage control unit in accordance with the externally generated clock signals.

3. The high voltage generating circuit of claim 2, wherein the first pump unit comprises:
    a first upper pump unit connected both to the source of the first transistor and to the gate of the second transistor, for executing a pumping or precharging operation in accordance with the first clock signal output from the external clock signal generator and the first high voltage clock signal output from the high voltage clock generating unit; and
    a first lower pump unit connected to the gate of the first transistor and to the source of the second transistor, for executing a pumping or precharging operation in accordance with the second clock signal output from the external clock signal generator and the second high voltage clock signal output from the high voltage clock generating unit.

4. The high voltage generating circuit of claim 3, wherein the first upper pump unit comprises:
    a first capacitor having an input terminal supplied with the first clock signal from the external clock signal generator, and an output terminal connected to the source of the first transistor;
    a second capacitor having an input terminal supplied with the first high voltage clock signal from the high voltage clock generating unit;
    a third transistor having a drain that is connected both to the output terminal of the first capacitor and to the gate of the second transistor, and a source connected to an output terminal of the second capacitor; and
    a fourth transistor having a drain connected to the output terminal of the first capacitor, and a gate connected both to the output terminal of the second capacitor and to the source of the third transistor.

5. The high voltage generating circuit of claim 4, wherein the first lower pump unit comprises:
    a third capacitor having an input terminal supplied with the second clock signal from the external clock signal generator, and an output terminal connected to the source of the second transistor;
    a fourth capacitor having an input terminal supplied with the second high voltage clock signal from the high voltage clock generating unit;
    a fifth transistor having a drain connected both to the output terminal of the third capacitor and to the gate of the first transistor, a gate connected to the drain of the third transistor, and a source connected to the output terminal of the fourth capacitor; and a sixth transistor having a drain connected to the output terminal of the third capacitor, and a gate connected both to the output terminal of the fourth capacitor and to the source of the fifth transistor.

6. The high voltage generating circuit of claim 1, wherein the voltage control unit comprises:

a first voltage control unit transistor having a gate supplied with the externally generated enable signal, and a source supplied with a ground voltage;

a first resistance having a first end connected to a drain of the first voltage control unit transistor;

a second resistance having a first end connected to a second end of the first resistance;

a comparator for comparing a reference voltage with a signal at a node between the first resistance and the second resistance, and for outputting the voltage control signal based on the comparison result; and a second voltage control unit transistor having a gate supplied with the voltage control signal of the comparator, a drain supplied with the high voltage of the charge pump unit, and a source connected to a second end of the second resistance to control the high voltage to achieve the predetermined voltage and to output the predetermined voltage to the external memory cell in accordance with the voltage control signal of the comparator.

7. The high voltage generating circuit of claim 1, wherein the high voltage clock generating unit comprises:

a first generating unit transistor having a gate supplied with the externally generated enable signal, and a source supplied with a ground voltage;

second and third generating unit transistors having sources connected in common with a drain of the first generating unit transistor, and gates correspondingly supplied with the first and second clock signals from the external clock signal generator; and first and second transistors having drains connected to drains of the second and third generating unit transistors, respectively, a gate of the first transistor being connected to the drain of the second transistor, a gate of the second transistor being connected to the drain of the first transistor, and sources for each of the first and second transistors being respectively supplied with the voltage control signal.

8. The high voltage generating circuit of claim 7, wherein respective magnitudes of the first and second high voltage clock signals output from the high voltage clock generating unit are variable depending on the high voltage output from the charge pump unit.

9. A high voltage generating circuit, comprising:

a charge pump circuit that stores and pumps charge to drive a high voltage output signal in accordance with a first clock signal and a high voltage second clock signal, wherein a voltage swing of the first clock signal is a constant and a voltage swing of the high voltage second clock signal varies according to an amplitude of a voltage control signal; and a voltage control circuit that generates the voltage control signal based on a comparison of the charge previously received from the charge pump circuit with a predetermined threshold value, controls the charge received from the charge pump circuit based on the voltage control signal, and generates the high voltage output signal based on the charge received from the charge pump circuit.

10. The high voltage generating circuit recited by claim 9, further comprising:

a clock generating unit that generates the high voltage second clock signal based on the first clock signal, wherein the high voltage second clock signal affects the amount of charge stored and pumped by the charge pump circuit.

11. The high voltage generating circuit recited by claim 9, further comprising:

a high voltage clock circuit generating the high voltage second clock signal in accordance with the first clock signal.

12. The high voltage generating circuit recited by claim 9, wherein the charge pump circuit stores and pumps the charge to drive the high voltage output signal also in accordance with a third clock signal and a high voltage fourth clock signal.

13. The high voltage generating circuit recited by claim 12, wherein a voltage swing of the third clock signal is a constant and a voltage swing of high voltage fourth clock signal varies according to the voltage control signal.

14. The high voltage generating circuit recited by claim 13, wherein the first clock signal is in phase with the high voltage second clock signal and the third clock signal is in phase with of the high voltage fourth clock signal.

15. A method of generating a high voltage output signal that maintains high voltage and high current characteristics, comprising:

storing and pumping charge to drive the high voltage output signal in accordance with a first clock signal and a high voltage second clock signal, wherein a voltage swing of the first clock signal is a constant and a voltage swing of the high voltage second clock signal varies according to an amplitude of a voltage control signal;

generating the voltage control signal based on a comparison of a predetermined threshold value with the charge previously pumped;

controlling an amount of the charge that is pumped based on the voltage control signal generated; and generating the high voltage output signal based on the amount of charge that is pumped.

16. The method recited by claim 15, further comprising:

generating the high voltage second clock signal based on the first clock signal, wherein the high voltage second clock signal affects the amount of charge that is stored and pumped.

17. The method recited by claim 16, wherein the storing and pumping the charge to drive the high voltage output signal is also performed in accordance with a third clock signal and a high voltage fourth clock signal.

18. The method recited by claim 17, wherein a voltage swing of the third clock signal is a constant and a voltage swing of the high voltage fourth clock signal varies according to the voltage control signal.

19. The method recited by claim 17, wherein the first clock signal is in phase with the high voltage second clock signal and the third clock signal is in phase with of the high voltage fourth clock signal.

* * * * *